(12) United States Patent
Ritchie et al.

(10) Patent No.: US 9,695,502 B2
(45) Date of Patent: Jul. 4, 2017

(54) PROCESS KIT WITH PLASMA-LIMITING GAP

(75) Inventors: Alan Ritchie, Menlo Park, CA (US); Donny Young, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 135 days.

(21) Appl. No.: 13/435,956

(22) Filed: Mar. 30, 2012

(65) Prior Publication Data

US 2013/0256128 A1 Oct. 3, 2013

(51) Int. Cl.
*C23C 14/34* (2006.01)
*H01J 37/32* (2006.01)
*H01J 37/34* (2006.01)

(52) U.S. Cl.
CPC ........ *C23C 14/34* (2013.01); *H01J 37/32495* (2013.01); *H01J 37/32642* (2013.01); *H01J 37/32651* (2013.01); *H01J 37/3405* (2013.01)

(58) Field of Classification Search
CPC ..................... H01J 37/32495; H01J 37/32651
USPC ........................................ 204/298.15, 298.11
See application file for complete search history.

(56) References Cited

U.S. PATENT DOCUMENTS

| | | | | |
|---|---|---|---|---|
| 4,968,374 A * | 11/1990 | Tsukada et al. | ......... | 156/345.47 |
| 4,986,890 A * | 1/1991 | Setoyama et al. | ....... | 204/298.06 |
| 5,632,873 A * | 5/1997 | Stevens | ................... | C23C 14/50 |
| | | | | 118/503 |
| 5,922,133 A * | 7/1999 | Tepman et al. | ................ | 118/720 |
| 6,051,122 A * | 4/2000 | Flanigan | ............. | C23C 16/4585 |
| | | | | 118/720 |
| 7,294,245 B2 * | 11/2007 | Fu | ............................ | 204/298.11 |
| 2008/0178801 A1 | 7/2008 | Pavloff et al. | | |
| 2010/0288728 A1 | 11/2010 | Han et al. | | |
| 2011/0278165 A1 | 11/2011 | Rasheed et al. | | |

FOREIGN PATENT DOCUMENTS

KR 10-2002-0001354 A 1/2002
KR 10-2005-0069452 A 7/2005

OTHER PUBLICATIONS

International Search Report and Written Opinion mailed Jul. 17, 2013 for PCT Application No. PCT/US2013/033337.
U.S. Appl. No. 13/435,949, filed Mar. 30, 2012, Young et al.
U.S. Appl. No. 13/435,766, filed Mar. 30, 2012, Ritchie et al.
U.S. Appl. No. 13/436,766, filed Mar. 30, 2012, Young et al.

* cited by examiner

*Primary Examiner* — Jason M Berman
(74) *Attorney, Agent, or Firm* — Moser Taboada; Alan Taboada

(57) ABSTRACT

Apparatus for processing substrates are provided herein. In some embodiments, an apparatus includes a process kit comprising a shield having one or more sidewalls configured to surround a first volume, the first volume disposed within an inner volume of a process chamber; and a first ring moveable between a first position, wherein the first ring rests on the shield, and a second position, wherein a gap is formed between an outer surface of the first ring and an inner surface of the one or more sidewalls, wherein a width of the gap is less than about two plasma sheath widths for a plasma formed at a frequency of about 40 MHz or higher and at a pressure of about 140 mTorr or lower.

14 Claims, 2 Drawing Sheets

PROCESS KIT WITH PLASMA-LIMITING GAP

FIELD

Embodiments of the present invention generally relate to plasma-enhanced substrate processing systems.

BACKGROUND

Substrate processing systems, such as physical vapor deposition (PVD) chambers, may use process kits to isolate a non-processing volume from a processing volume of an inner volume. For example, the process kits may be used to prevent materials, such as reactive species formed from a plasma, sputtered metals, or the like from contaminating one or more components on the non-processing side of the inner volume. The inventors have observed that for plasma-enhanced PVD processes that use higher radio frequency (RF) frequencies and lower chamber pressures, materials from the processing volume can travel through the gaps in the components of the process kit and contaminate components on the non-processing side of the inner volume.

Accordingly, the present invention provides improved process kits for use in plasma-enhanced substrate processing systems.

SUMMARY

Apparatus for processing substrates are provided herein. In some embodiments, an apparatus includes a process kit, the process kit comprising a shield having one or more sidewalls configured to surround a first volume, the first volume disposed within an inner volume of a process chamber; and a first ring moveable between a first position, wherein the first ring rests on the shield, and a second position, wherein a gap is formed between an outer surface of the first ring and an inner surface of the one or more sidewalls, wherein a width of the gap is less than about two plasma sheath widths for a plasma formed at a frequency of about 40 MHz or higher and at a pressure of about 140 mTorr or lower.

In some embodiments, the apparatus includes a substrate processing system includes a process chamber having an inner volume; a shield disposed in the inner volume and having one or more sidewalls configured to surround a first volume within the inner volume; a substrate support disposed in the inner volume; and a first ring moveable between a first position, wherein the first ring rests on the shield, and a second position, wherein the first ring rests atop the substrate support and wherein a gap is formed between an outer surface of the first ring and an inner surface of the one or more sidewalls, wherein a width of the gap is less than about two plasma sheath widths for a plasma formed at a frequency of about 40 MHz or higher and at a pressure of about 140 mTorr or lower.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
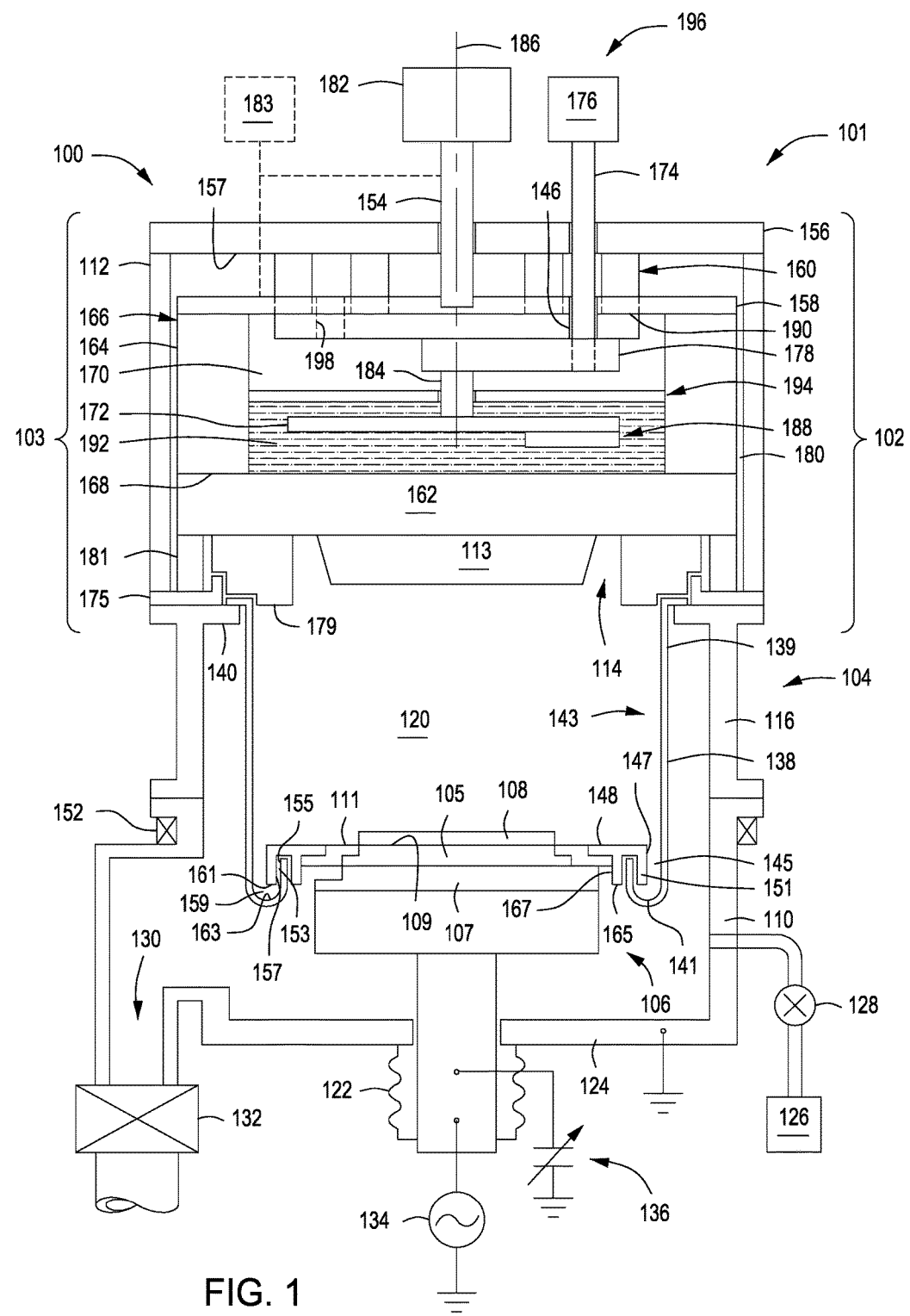
FIG. 1 depicts a schematic cross sectional view of a process chamber in accordance with some embodiments of the present invention.
Figure 2:
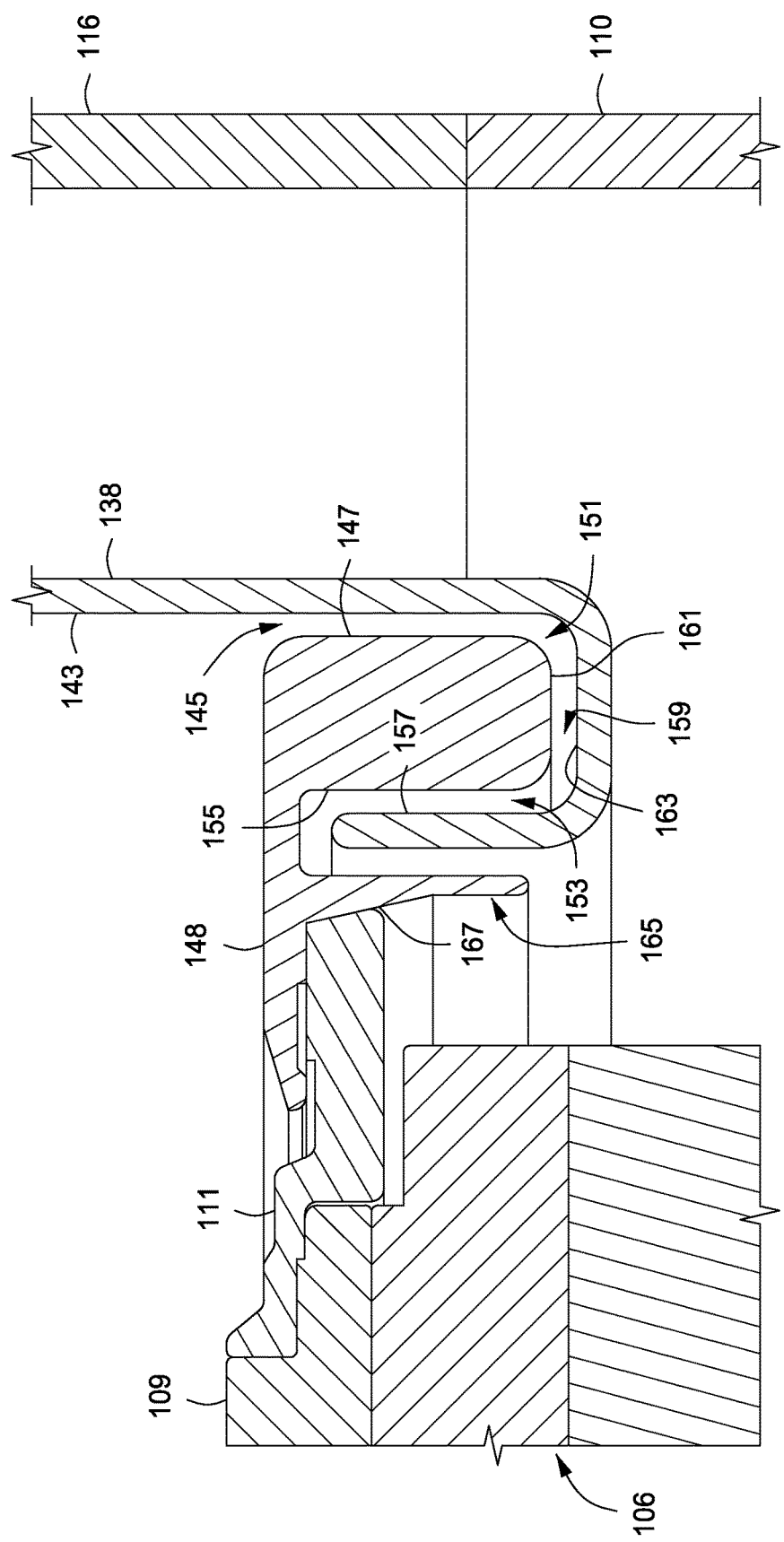
FIG. 2 depicts a cross sectional side view of a portion of a substrate support and process kit in a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of process kits for use in plasma-enhanced substrate processing system are provided herein. The process kit may be advantageously configured to at least limit a plasma formed at frequencies of about 40 MHz or higher and at pressures of about 140 mTorr or lower from traveling through one or more gaps between adjacent components of the process kit, such as between a shield and a cover ring of the process kit. Other and further embodiments of a process kit are discussed below.

FIG. 1 depicts a simplified, cross-sectional view of a PVD chamber 100 in accordance with some embodiments of the present invention. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers, including those configured for other types of processing besides PVD, may also benefit from modifications in accordance with the inventive apparatus disclosed herein.

In some embodiments of the present invention, the PVD chamber 100 includes a chamber lid 101 disposed atop a process chamber 104 and removable from the process chamber 104. The chamber lid 101 may include a target assembly 102 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a shield 138 as discussed below) and ultimately back to the grounding assembly 103 of the chamber lid 101. The RF power source 182 may provide RF power to the target assembly 102 as discussed below.

The substrate support 106 has a material-receiving surface facing a principal surface of a target 114 and supports the substrate 108 to be sputter coated in planar position opposite to the principal surface of the target 114. The substrate support 106 may include a dielectric member 105 having a substrate processing surface 109 for supporting the substrate 108 thereon. In some embodiments, the substrate support 108 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 of the process chamber 104. The first volume 120 may be a portion of the inner volume of the process chamber 104 that is used for processing the substrate 108 and may be separated from the remainder of the inner volume (e.g., a non-processing volume) during processing of the substrate 108. The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing, or first volume, of the process chamber 104 and to protect other chamber components from damage and/or contamination from processing. In some embodiments, the shield 138 may be coupled to a ledge 140 of an upper grounded enclosure wall 116 of the process chamber 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 110 and the grounding assembly 103 of the chamber lid 101. However, other RF return paths are possible, such as via the grounded shield 138.

The shield 138 extends downwardly and may include one or more sidewalls 139 configured to surround the first volume 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition. Although discussed above as the substrate support 106 being moveable relative to the shield 138 and the first ring 148, in some embodiments, it may be possible that the substrate support 106 is stationary and the shield 138 and the first ring 148 are moveable relative to the substrate support 106.

An additional dielectric ring 111 may be used to shield the periphery of the substrate 108 from deposition. For example, the dielectric ring 111 may be disposed about a peripheral edge of the substrate support 106 and adjacent to the substrate processing surface 109 as illustrated in FIG. 1.

When the first ring 148 is in the second position (e.g., when disposed on the outer periphery of the substrate support 106, a gap 145 may be formed between an outer surface 147 of the first ring 148 and the inner surface 143 of the one or more sidewalls 139. The gap 145 may be formed by a first protrusion 151 of the first ring 148 which extends from a bottom surface of the first ring 148 towards a bottom surface of a trench 141. The first protrusion 151 may include the outer surface 147 of the first ring 148.

The inventors have observed that for some plasma-enhanced PVD processes that use higher radio frequency (RF) frequencies and lower chamber pressures, materials from the processing volume can travel through the gaps in the components of the process kit and contaminate components on the non-processing side of the inner volume. The inventors believe that the problem is due to the plasma sheath width at those process conditions can shrink to less than the width between gaps formed between components of the process kit, thereby allowing the plasma to enter the gap and to cause arcing, deposition, or other undesirable effects that can lead to the above-mentioned contamination.

As such, in some embodiments, the gap 145 may be less than about two plasma sheath widths for a plasma formed at a frequency of about 40 MHz or higher and at a pressure of about 140 mTorr or lower. For example, the frequency may range from about 20 MHz to about 162 MHz. In some embodiments, the frequency may be less than about 20 MHz. The pressure used to form the plasma may range from about 60 mTorr to about 140 mTorr. In some embodiments, the width of the gap 145 is less than about 6 millimeters (mm). In some embodiments, the gap 145 has a length to width ratio of at least about 4:1. The inventors have discovered that in some embodiments that a length to width ratio of at least about 4:1 may be necessary to limit or prevent plasma formed in the first volume 120 from reaching a non-processing volume of the inner volume disposed below the substrate support 106.

In some embodiments, a second gap 153 may be formed between an inner surface 155 of the first protrusion 151 and an inner surface 157 of the trench 141 when the first ring 148 is in the second position. The second gap 153 may be substantially similar to the gap 145 and may have a width that is less than about two plasma sheath widths for a plasma formed at a frequency of about 40 MHz or higher and at a pressure of about 140 mTorr or lower. In some embodiments, the frequency may range from about 20 MHz to about 162 MHz. In some embodiments, the frequency may be less than about 20 MHz. The pressure used to form the plasma may range from about 60 mTorr to about 140 mTorr. In some embodiments the width of the second gap 153 may be about 6 mm. In some embodiments, the second gap 153 may have an aspect ratio of at least about 4:1.

In some embodiments, a third gap 159 may be formed between a bottom surface 161 of the first protrusion 151 and a bottom surface 163 of the trench 141 when the first ring 148 is in the second position. The third gap 159 may be substantially similar to the gaps 145, 153 and may have a width that is less than about two plasma sheath widths for a plasma formed at a frequency of about 40 MHz or higher and at a pressure of about 140 mTorr or lower. In some embodiments, the frequency may range from about 20 MHz to about 162 MHz. In some embodiments, the frequency may be less than about 20 MHz. The pressure used to form the plasma may range from about 60 mTorr to about 140 mTorr. In some embodiments the width of the third gap 159 may be about 6 mm. In some embodiments, the third gap 159 may have an aspect ratio of at least about 4:1.

The first ring 148 may include a second protrusion 165 extending from a lower surface of the first ring 148. The second protrusion 165 may be disposed inward of the first protrusion as illustrated in FIG. 1. The second protrusion 165 may be configured to interface with the substrate support 106 to align the first ring 148 with respect to the shield 138 when the first ring 148 is moved into the second position as the substrate support is moved into the deposition position. For example, a substrate support facing surface 167 of the second protrusion may be tapered, notched or the like to rest in/on a corresponding surface on the substrate support 106 when the first ring 148 is in the second position, such that the gaps 145, 153, 159 are defined by the alignment of the first ring 148 to have widths as discussed above.

In some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the process chamber 104, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the process chamber 104. In use, when the chamber lid 101 is opened or closed, the support member 175 maintains the dark space shield 179 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include the backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between 5 mm and 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of the magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 188 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

While the foregoing is directed to embodiments of the present invention, other and further embodiments of the invention may be devised without departing from the basic scope thereof.

The invention claimed is:

1. A process kit, comprising:
a shield, comprising:
a u-shaped lower portion forming a trench; and
one or more vertical sidewalls configured to surround a first volume, the first volume disposed within an inner volume of a process chamber; and
a first ring, comprising:
a first protrusion extending from a lower surface of the first ring into the trench;
a second protrusion extending from the lower surface of the first ring and outside of the trench,
wherein the first ring is moveable between a first position, in which the first ring rests on the shield, and a second position, in which the first ring does not contact the shield,
wherein a gap is formed between a radially outermost surface of the first protrusion and an adjacent inner surface of the one or more vertical sidewalls,
wherein a width of the gap is less than about two plasma sheath widths for a plasma formed at a frequency of about 40 MHz or higher and at a pressure of about 140 mTorr or lower,
wherein the gap has a length to width ratio of at least about 4:1 to limit or prevent plasma formation in the gap.

2. The process kit of claim 1, wherein the width of the gap is less than about two plasma sheath widths when the pressure used to form the plasma ranges from about 60 to about 140 mTorr.

3. The process kit of claim 1, wherein the width of the gap is less than about 6 mm.

4. The process kit of claim 1, wherein the second protrusion is configured to interface with a substrate support to align the first ring with respect to the shield when the first ring is in the second position.

5. The process kit of claim 1, further comprising:
a second gap formed between an inner surface of the first protrusion and an inner surface of the trench when the first ring is in the second position, wherein a width of the gap is less than about two plasma sheath widths for a plasma formed at at least one of a frequency of about 40 MHz or higher or a pressure ranging from about 60 to about 140 mTorr.

6. The process kit of claim 5, wherein the second gap has a length to width ratio of at least about 4:1.

7. The process kit of claim 1, further comprising:
a third gap formed between a bottom surface of the first protrusion and the bottom surface of the trench when the first ring is in the second position, wherein a width of the gap is less than about two plasma sheath widths for a plasma formed at at least one of a frequency of about 40 MHz or higher or a pressure ranging from about 60 to about 140 mTorr.

8. A substrate processing system, comprising:
a process chamber having an inner volume;
a shield disposed in the inner volume, wherein the shield comprises:
a u-shaped lower portion forming a trench; and
one or more vertical sidewalls configured to surround a first volume within the inner volume;
a substrate support disposed in the inner volume; and
a first ring, comprising:
a first protrusion extending from a lower surface of the first ring into the trench;
a second protrusion extending from the lower surface of the first ring and outside of the trench,
wherein the first ring is moveable between a first position, in which the first ring rests on the shield, and a second position, in which the first ring does not contact the shield and rests atop the substrate support,
wherein a gap is formed between a radially outermost surface of the first protrusion and an adjacent inner surface of the one or more vertical sidewalls,
wherein a width of the gap is less than about two plasma sheath widths for a plasma formed at a frequency of about 40 MHz or higher and at a pressure of about 140 mTorr or lower,
wherein the gap has a length to width ratio of at least about 4:1 to limit or prevent plasma formation in the gap.

9. The substrate processing system of claim 8, wherein the width of the gap is less than about two plasma sheath widths when the pressure used to form the plasma ranges from about 60 to about 140 mTorr.

10. The substrate processing system of claim 8, wherein the width of the gap is less than about 6 mm.

11. The substrate processing system of claim 8, wherein the second protrusion is configured to interface with the substrate support to align the first ring with respect to the shield when the first ring is in the second position.

12. The substrate processing system of claim 8, further comprising:
a second gap formed between an inner surface of the first protrusion and an inner surface of the trench when the first ring is in the second position, wherein a width of the gap is less than about two plasma sheath widths for a plasma formed at at least one of a frequency of about 40 MHz or higher or a pressure ranging from about 60 to about 140 mTorr.

13. The substrate processing system of claim 8, further comprising:
a third gap formed between a bottom surface of the first protrusion and the bottom surface of the trench when the first ring is in the second position, wherein a width of the gap is less than about two plasma sheath widths for a plasma formed at at least one of a frequency of about 40 MHz or higher or a pressure ranging from about 60 to about 140 mTorr.

14. The substrate processing system of claim 8, wherein the substrate support further comprises:
a substrate processing surface; and
a dielectric ring disposed about a peripheral edge of the substrate support and adjacent to the substrate processing surface.

* * * * *